(12) United States Patent
Liu et al.

(10) Patent No.: US 9,202,920 B1
(45) Date of Patent: Dec. 1, 2015

(54) METHODS FOR FORMING VERTICAL AND SHARP JUNCTIONS IN FINFET STRUCTURES

(71) Applicants: STMicroelectronics, Inc., Coppell, TX (US); International Business Machines Corporation, Armonk, NY (US); GLOBALFOUNDRIES Inc., Grand Cayman (KY)

(72) Inventors: Qing Liu, Watervliet, NY (US); Chun-chen Yeh, Clifton Park, NY (US); Ruilong Xie, Schenectady, NY (US); Xiuyu Cai, Niskayuna, NY (US)

(73) Assignees: STMicroelectronics, Inc., Coppell, TX (US); International Business Machines Corporation, Armonk, NY (US); GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/447,727

(22) Filed: Jul. 31, 2014

(51) Int. Cl.
*H01L 29/78* (2006.01)
*H01L 29/66* (2006.01)

(52) U.S. Cl.
CPC ........ *H01L 29/785* (2013.01); *H01L 29/66553* (2013.01); *H01L 29/66795* (2013.01)

(58) Field of Classification Search
CPC ............ H01L 29/66795; H01L 29/785; H01L 27/0886; H01L 21/823431; H01L 29/7851; H01L 21/28247; H01L 21/823821; H01L 21/02532; H01L 21/845; H01L 21/02112; H01L 21/30604; H01L 21/76897; H01L 21/8238
See application file for complete search history.

(56) References Cited

U.S. PATENT DOCUMENTS

| | | | |
|---|---|---|---|
| 2008/0067613 A1* | 3/2008 | Anderson et al. | 257/401 |
| 2010/0252862 A1* | 10/2010 | Ko et al. | 257/192 |
| 2014/0084342 A1* | 3/2014 | Cappellani et al. | 257/192 |

* cited by examiner

*Primary Examiner* — Roy Potter
*Assistant Examiner* — Paul Patton
(74) *Attorney, Agent, or Firm* — Gardere Wynne Sewell LLP (57) ABSTRACT

Methods and structures for forming short-channel finFETs with vertical and abrupt source and drain junctions are described. During fabrication, source and drain regions of the finFET may be recessed vertically and laterally under gate spacers. A buffer having a high dopant density may be formed on vertical sidewalls of the channel region after recessing the fin. Raised source and drain structures may be formed at the recessed source and drain regions. The raised source and drain structures may impart strain to the channel region.

31 Claims, 11 Drawing Sheets

METHODS FOR FORMING VERTICAL AND SHARP JUNCTIONS IN FINFET STRUCTURES

BACKGROUND

1. Technical Field

The technology relates to methods and structures for making finFETs having vertical and abrupt source and drain junctions.

2. Discussion of the Related Art

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors.

Two types of transistors have emerged within the MOSFET family of transistors that show promise for scaling to ultra-high density and nanometer-scale channel lengths. One of these transistor types is a so-called fin field-effect transistor or "finFET." The channel of a finFET is formed in a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

The second type of transistor is called a fully-depleted, silicon-on-insulator or "FD-SOI" FET. The channel, source, and drain of an FD-SOI FET is formed in a thin planar semiconductor layer that overlies a thin insulator. Because the semiconductor layer and the underlying insulator are thin, the body of the transistor (that lies below the thin insulator) can act as a second gate. The thin layer of semiconductor on insulator permits higher body biasing voltages that can boost performance. The thin insulator also reduces leakage current to the transistor's body region that would otherwise occur in bulk FET devices.

SUMMARY

Conventional fabrication methods can lead to tapered source and drain junction profiles adjacent to a finFET's channel region. Typically, this leads to a shorter effective channel length near the top of the fin, and a longer channel length near the base of the fin. Such tapered junction profiles can undesirably lead to device threshold variability on a same substrate.

The described technology relates to methods and structures for making vertical and sharp or abrupt source and drain junctions in finFETs. Vertical and abrupt source and drain junction profiles can lead to improved device performance, e.g., higher effective current ($I_{eff}$) at shorter channel lengths for a fixed off-state leakage current. Vertical junction profiles may be formed using a delta-dopant buffer deposited on recessed source and drain structures. The delta-dopant buffer additionally provides a localized (delta profile) high dopant concentration to form abrupt dopant profiles at the source and drain junctions of a finFET. Raised source and drain structures may be epitaxially grown on the buffer, and may be used to impart strain to the channel region of the finFET. In some embodiments, a thermal diffusion step for driving in dopants is not needed during fabrication of the finFET, so that the dopant profiles remain abrupt and vertical, substantially as deposited.

According to some embodiments, a finFET having vertical and abrupt source and drain junctions comprises a fin formed of a first semiconductor material having a channel region, at least a gate conductor formed over the fin, and a spacer material formed adjacent the gate conductor. The finFET may further include recessed portions of the fin at source and drain regions of the fin, a second semiconductor material formed over the recessed portions, and a buffer disposed between the second semiconductor material and the first semiconductor material. In various embodiments, a first portion of the buffer extends vertically adjacent an edge of the channel region and the spacer material extends toward the source and drain regions beyond the buffer.

In some aspects, the recessed portions of the fin have upper surfaces lying below an upper surface of a local insulating layer disposed on either side of the recessed portions. In some implementations, the upper surfaces of the recessed portions lie between approximately 5 nm and approximately 20 nm below the upper surface of the local insulating layer.

According to some implementations, a dopant density of the buffer is higher than a dopant density of the first semiconductor material and the second semiconductor material. In some aspects, the dopant density of the buffer is between approximately $5 \times 10^{21}$ cm$^{-3}$ and approximately $1 \times 10^{23}$ cm$^{-3}$. In some implementations, the buffer has a thickness less than 6 molecular layers. In some aspects, a second portion of the buffer may extend horizontally along upper surfaces of the recessed portions of the fin at the source and drain regions. In some implementations, the spacer material extends toward the source and drain regions between approximately 3 nm and approximately 9 nm beyond the buffer.

According to some aspects, the first semiconductor material comprises a first semiconductor having a first crystal lattice constant and the second semiconductor material comprises a second semiconductor having a second crystal lattice constant different from the first. In some aspects, the first semiconductor material is Si and the second semiconductor material is SiGe or SiC. In some implementations, the second semiconductor material may be epitaxially formed.

In some implementations, the second semiconductor material extends above an upper surface of the fin at the channel region. In some aspects, the second semiconductor material electrically connects a plurality of fins at least at their source regions. In some cases, a third semiconductor material may be formed at the source and drain regions to cover at least a portion of the second semiconductor material.

According to some aspects, the channel region of a finFET having vertical and abrupt source and drain junctions has a length between approximately 10 nm and approximately 40 nm. In some implementations, the channel region has a height between approximately 30 nm and approximately 100 nm and a width between approximately 5 nm and approximately 15 nm.

The foregoing aspects and implementations associated with a finFET having vertical, abrupt source and drain junctions may be included in any suitable combination in one or more embodiments of finFETs. Additionally, any of the foregoing finFET embodiments may be fabricated using method embodiments described below.

According to some embodiments, a method for forming a finFET having vertical source and drain junctions may comprise acts of forming a gate conductor over a fin, forming a spacer layer on sidewalls of the gate conductor, recessing source and drain regions of the fin vertically, and recessing vertical edges of the fin adjacent a channel region horizontally beyond an outer edge of the spacer layer. The method may further include, in some embodiments, depositing a buffer on at least the recessed vertical edges of the channel region.

In some aspects, recessing the vertical edges of the fin may comprise recessing the edges between approximately 3 nm and approximately 9 nm beyond the outer edge of the spacer layer. In some cases, recessing the vertical edges of the fin comprises isotropically etching the fin.

In some implementations, recessing the source and drain regions of the fin vertically may comprise etching the fin at the source and drain regions to reduce the fin height by at least 40%. According to some aspects, recessing the source and drain regions of the fin vertically may comprise etching the fin at the source and drain regions to reduce the fin height such that upper surfaces of recessed portions of the fin at the source and drain regions lie below an upper surface of a local insulator disposed on either side of the recessed portions. In some aspects, recessing the source and drain regions of the fin vertically may comprise etching the fin at the source and drain regions to reduce the fin height such that upper surfaces of recessed portions of the fin at the source and drain regions lie between approximately 5 nm and approximately 20 nm below an upper surface of a local insulator disposed on either side of the recessed portions. In some cases, recessing the source and drain regions of the fin vertically comprises anisotropically etching the fin.

According to some implementations, depositing the buffer may comprise forming the buffer by atomic layer deposition. In some aspects, depositing the buffer further comprises forming the buffer to be less than 6 molecular layers. In some implementations, depositing the buffer further comprises doping the buffer with donor or acceptors to obtain a density between approximately $5 \times 10^{21}$ cm$^{-3}$ and approximately $1 \times 10^{23}$ cm$^3$.

In some aspects, a method for forming a finFET having vertical source and drain junctions may further comprise forming raised source and drain structures at the recessed portions of the fin, wherein the raised source and drain structures extend above an upper surface of the fin at the channel region. In some implementations, the raised source and drain structures are formed of a semiconductor material that has a lattice constant that is different from a lattice constant of the fin. In some cases, forming the raised source and drain structures may comprise epitaxially growing the raised source and drain structures from at least the recessed portions of the fin. In some aspects, forming the raised source and drain structures may comprise epitaxially growing the raised source and drain structures to connect a plurality of fins at least at the source regions.

According to some implementations, the fin of finFET having vertical source and drain junctions may be formed of Si and the raised source and drain structures may be formed of SiGe or SiC.

The foregoing aspects and implementations relating to acts for making a finFET may be used in any suitable combination in one or more embodiments of methods for making finFETs having vertical and abrupt source and drain junctions.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1A:
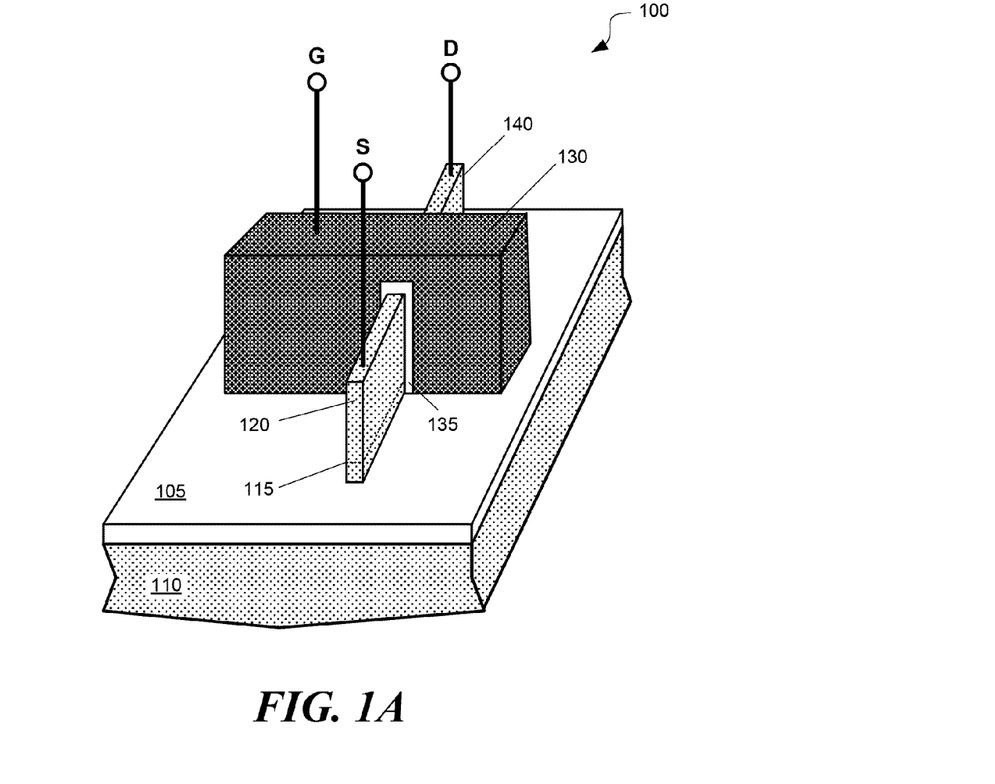
FIG. 1A is a perspective view depicting a finFET, according to some embodiments.

An example of a finFET 100 is depicted in the perspective view of FIG. 1A. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than 50 nanometers. There may be an electrically-insulating layer 105, e.g., an oxide layer, on a surface of the substrate 110. The fin may pass through the insulating layer 105, but be attached to the semiconducting substrate 110 at a lower region of the fin. A gate structure comprising a conductive gate material 130 (e.g., polysilicon, metal, or a metal silicide) and a gate insulator 135 (e.g., an oxide or high-k dielectric) may be formed over a region of the fin. The finFET may further include a source region 120 and drain region 140 adjacent to the gate. A finFET may also include integrated source S, gate G, drain D, and body B (not shown) interconnects to provide electrical connections to the source, gate, drain, and back body regions of the device.

FinFETs like those depicted in FIG. 1A exhibit favorable electrostatic properties for scaling to high-density, low-power, integrated circuits. Because the fin and channel are raised from the substrate, the devices can exhibit reduced cross-coupling between proximal devices. For the device shown in FIG. 1A, the fin 115 may be formed from the bulk substrate 110 by an etching process, and is therefore attached to the substrate at a base region of the fin, a region occluded in the drawing by the adjacent insulator 105. The insulator 105 may be formed after the etching of the fin 115. Because the fin 115 is attached to the semiconductor substrate, some leakage current and cross-coupling may occur via the base region of the fin.

Figure 1B:
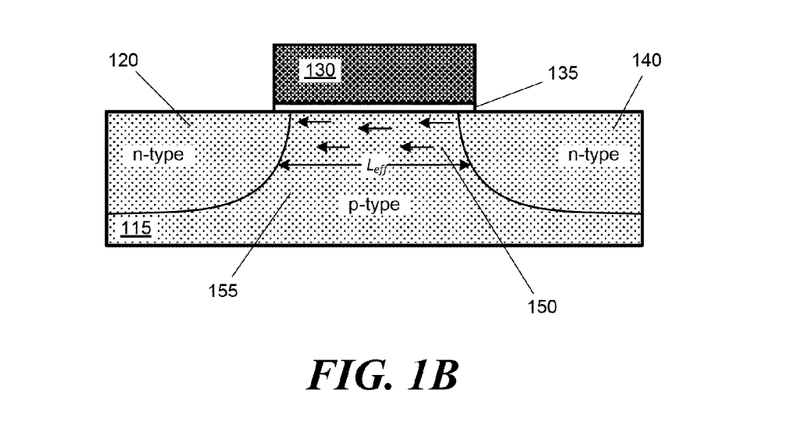
FIGS. 1B-1E depict cross-sectional views of finFET fins, according to various embodiments.
Figure 1C:
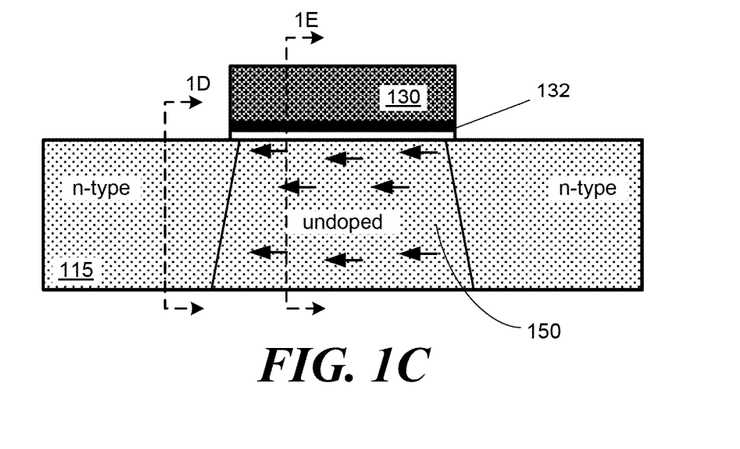

In some embodiments, source, channel, and drain regions of a finFET may be doped with donor and acceptor impurities to create different regions of different conductivity types, as depicted in FIGS. 1B-1C. Several different configurations of source, channel, and drain regions are possible. According to some embodiments, source region 120 and drain region 140 may be doped to be of a first conductivity type and the channel region 150 may be doped to be of an opposite conductivity type, as depicted in FIG. 1B. The terms "source region" and "drain region" as used may include extension regions of the fins that lie between source and drain contact regions and the channel region of the finFET device.

Figure 1D:
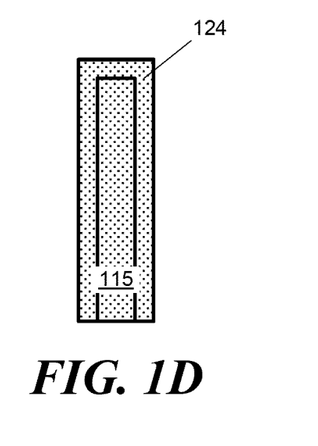

The finFET may further include a body region 155 that may be of a same conductivity type as the channel region. In some embodiments, a channel region 150 of a finFET may be undoped, as depicted in FIG. 1C. The doping of source and drain regions in a finFET may be of various geometries. As depicted in FIG. 1B, portions of the fin 115 adjacent the channel region 150 may be doped to form source 120 and drain 140 regions. Alternatively, outer sheath portions 124 of a fin 115 adjacent the channel region may be doped to form source and drain regions, as depicted in FIGS. 1D-1E.

Figure 1E:
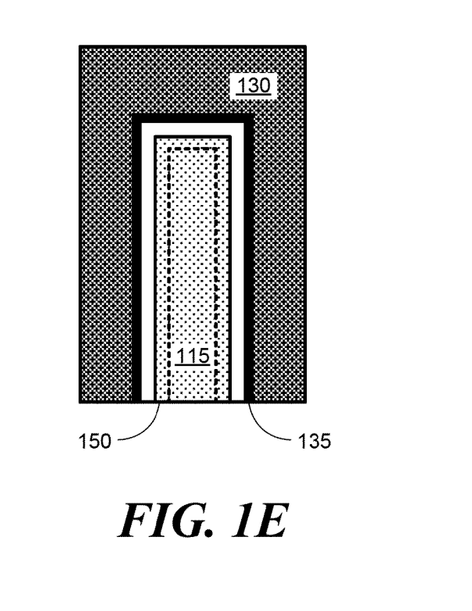

FIG. 1C and FIG. 1E depict a three-dimensional nature of a channel region 150 in a finFET, according to some embodiments. In some embodiments, the entire fin portion encased by the gate structure may be inverted and form a bulk channel rather than a surface channel. A metallic film 132 may be deposited between a gate electrode 130 and gate oxide 135 in some implementations to improve gate conductance and gate switching speeds.

The inventors have recognized and appreciated that conventional methods for forming finFETs can lead to devices having sloped or tapered source and drain junctions (lying between the device's channel region 150 and source and drain regions 120, 140), as depicted in FIGS. 1B-1C, for example. For devices with narrow fins, for example, less than 15 nm, current methods of in-situ doping for source and drain regions adjacent the channel region can result in problematic tapering of the source and drain junction profiles, lead to appreciable variable channel length along the height of the fin, and degrade device performance. For example, source and drain dopants deposited at source and drain regions of a finFET may be driven in using a spike anneal process. The spike anneal may cause higher temperatures near the surface of the substrate and near the top of the fins and lower temperatures near the base of the fins. The temperature differential along the height of the fin can lead to different diffusion rates along the fin's height. Dopants near the top of the fin may diffuse farther than dopants near the base of the fin, yield profiles similar to those shown in FIGS. 1B-1C.

Because a well or halo ion implant may not be used for narrow-channel finFETs, there is presently not an effective method for gradient control of dopants at the source and drain junctions of narrow channel finFETs. The inventors have appreciated that short-channel effect (SCE) in tapered junction profiles degrades near the top of the fin, and punch through can occur in narrow-channel, short-channel-length finFETs. Additionally, there can be variability in dopant diffusion between devices on a same substrate due to small variations in thermal processing during source and drain dopant diffusion. Such variability can lead to variable threshold values among fins on a same substrate.

As used herein, spatial references "top," "bottom," "upper," "lower," "vertical," "horizontal," and the like may be used for convenience when referring to structures of finFETs. These references are intended to be used in a manner consistent with the drawings only for teaching purposes, and are not intended as absolute references for finFET structures. For example, finFETs may be oriented spatially in any manner different from the orientations shown in the drawings. "Vertical" is used to refer to a direction normal to the substrate surface, and "horizontal" is used to refer to a direction parallel to the substrate surface when referring to the drawings. "Upper" is used to refer to a vertical direction away from the substrate.

To mitigate junction tapering, the inventors have conceived of methods and structures for forming finFETs having sharp, vertical junctions that can be formed via a diffusion-less process. According to some embodiments, source and drain regions of a finFET may be recessed and a delta-doped buffer deposited at the recessed source and drain regions. The delta-doped buffer may have a high dopant concentration, and substantially establish the location of the source and drain junctions. Subsequently, raised source and drain structures may be formed adjacent the delta-doped buffer. A thermal diffusion process may not be used during fabrication of the finFET. In some embodiments, the raised source and drain structures may impart stress to the channel region of the finFET, and improve carrier mobility in the channel region.

Strain in a channel region may improve the mobility of carriers in the channel region, and thereby improve device speed. For example compressive straining of silicon (Si) can improve the mobility of holes within silicon. Tensile straining of Si can improve electron mobility. When enough strain is applied, the performance of silicon-based transistor devices can approach or even surpass the performance of devices based on compound semiconductors (e.g., SiGe, SiC, GaAs, InP, InGaAs, GaN, AlGaAs, etc.), which may require more difficult and expensive processing techniques.

Figure 2A:
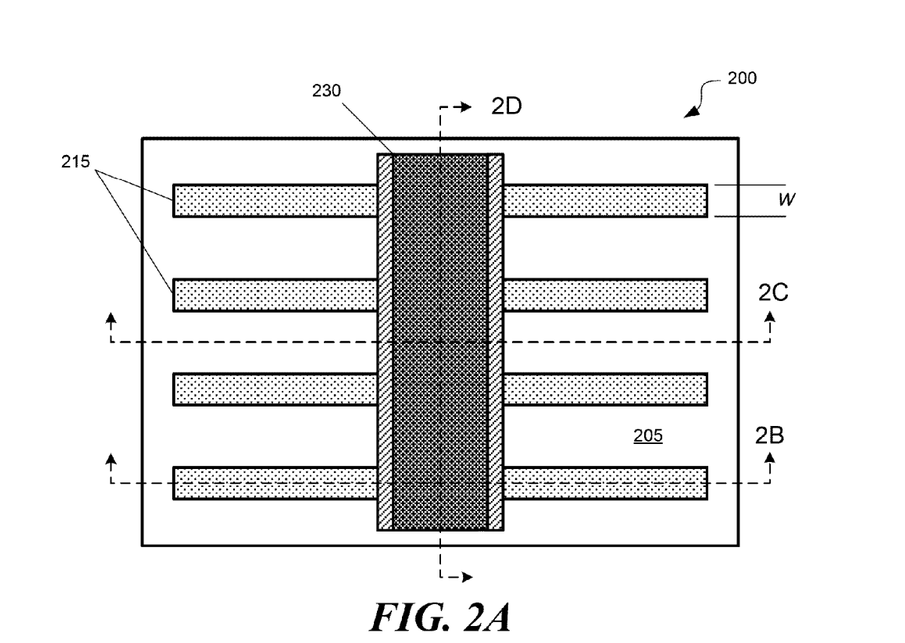
FIG. 2A depicts a plan view of a finFET, according to some embodiments.
Figure 2B:
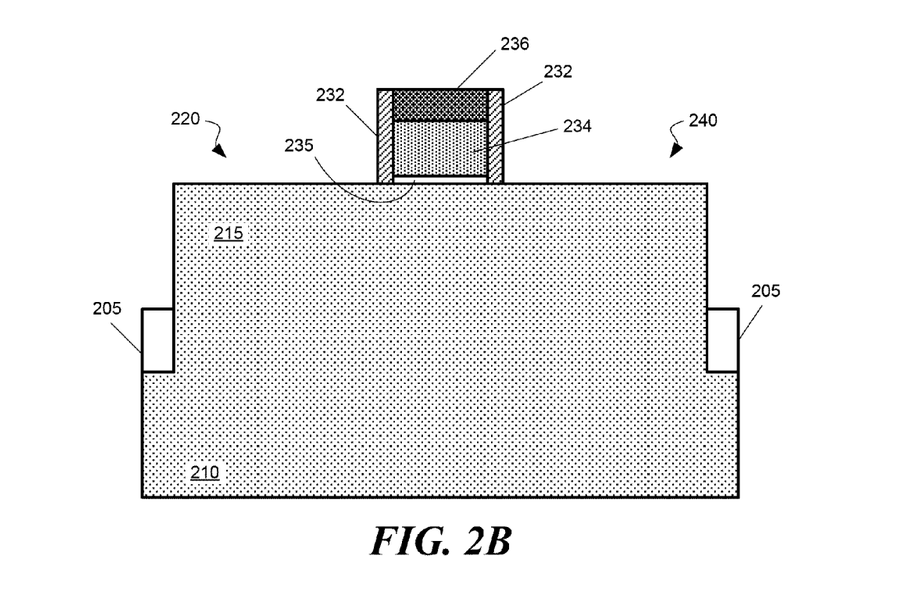
FIGS. 2B-2K depict structures associated with processes for forming finFETs with vertical junctions, according to some embodiments.
Figure 2C:
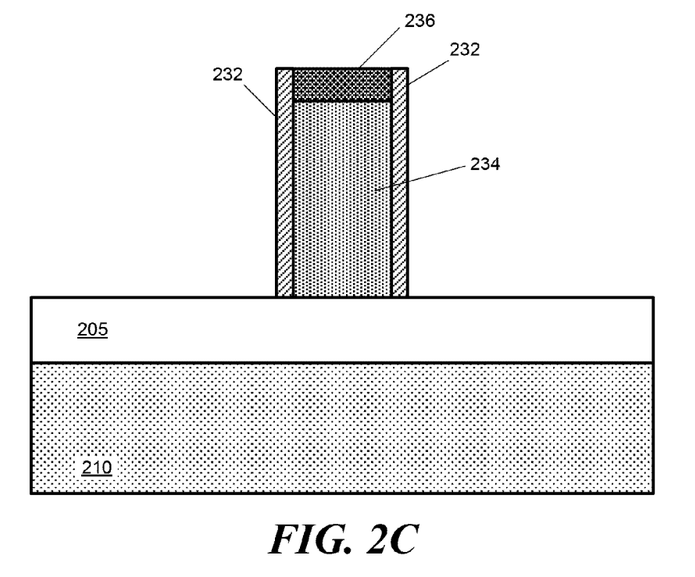
Figure 2D:
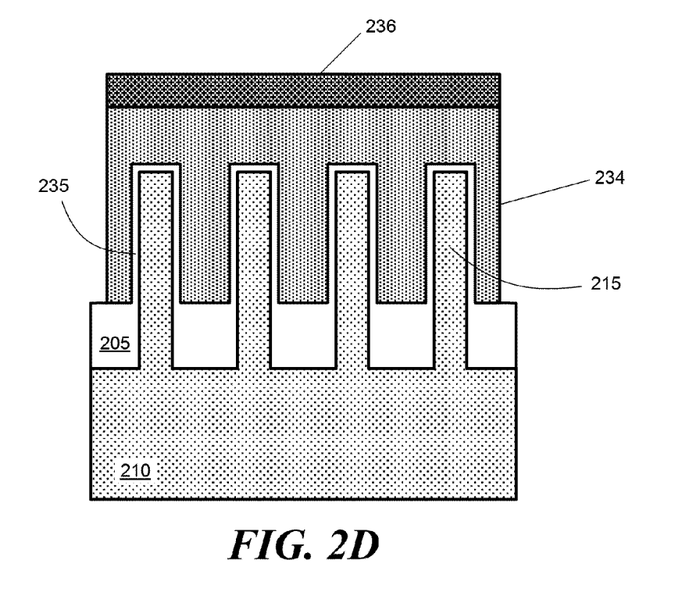

FIGS. 2A-2K depict structures associated with process steps that may be used to fabricate vertical and abrupt source and drain junctions in finFETs, according to some embodiments. A process for forming a finFET having abrupt, vertical junctions may begin by forming structures for at least one finFET 200, as depicted in FIGS. 2A-2D, on a substrate 210. FIG. 2A depicts a plan view of a finFET having four fins 215, a gate structure 230, and an insulating layer 205 formed near the base of the fins. Though four fins are shown, a finFET 200 may have any number of fins. FIGS. 2B-2D depict elevation views of the finFET corresponding to the dashed lines in FIG. 2A.

According to some embodiments, a finFET 200 may comprise one or more fins 215 having widths between approximately 3 nanometers (nm) and approximately 20 nm. The length of the fins may be between approximately 40 nm and approximately 200 nm. Is some implementations, the fin lengths may be longer. In some embodiments, a height of the fins may be between approximately 30 nm and approximately 100 nm, and a spacing between fins may be between approximately 20 nm and approximately 150 nm. The substrate 210 may be formed or obtained by any suitable means, and may comprise a bulk, integrated-circuit grade, semiconductor substrate in some embodiments, or a semiconductor-on-insulator substrate in other embodiments. The substrate 210 may include any suitable semiconductor (e.g., Si, Ge, GaAs, AlGaAs, InGaAs, InP, GaN, SiC, etc.).

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

According to some embodiments, an insulating layer 205 (e.g., an oxide or nitride) may be formed at the base of the fins 215. The insulating layer may have a thickness between approximately 5 nm and approximately 750 nm. The insulator may be deposited locally around one or more fins. The insulator may be a pad oxide in some embodiments, and may be formed by any suitable process, e.g., a thermal oxidation process, plasma deposition process, or ion implantation and anneal.

According to some embodiments, the fins 215 and gate structure 230 may be formed by any suitable combination of lithographic processes that may involve forming a pattern and selectively etching one or more materials. In some embodiments, the fins may be formed using a sidewall image transfer (SIT) process that is described in further detail in U.S. patent application Ser. No. 13/964,009, filed on Aug. 9, 2013, and incorporated herein by reference in its entirety. An SIT process may be referred to as a self-aligned double patterning (SADP) process. In some implementations, fins may be formed using a double patterning process, e.g., resist-on-resist patterning techniques (which may include a lithography-etch-lithography-etch (LELE) process or a lithography-freeze-lithography-etch (LFLE) process). In other embodiments, the fins may be formed using interferometric lithography, imprint lithography, photolithography, extreme ultraviolet (EUV) lithography, or x-ray lithography.

The gate structures may be formed using any of the above lithographic techniques. In some embodiments, the gate structures 230 are formed using photolithography and selective etching to pattern a hard mask on at least one layer of material deposited over the fins, selectively etching gates from the at least one layer, and subsequently forming spacers on the gates.

Selective etching, as used herein, comprises subjecting a substrate to an etchant that preferentially etches at least one material at a faster rate than a second material. The second material may be formed as a hard mask (e.g., an inorganic material such as an oxide, nitride, metal, or the like) or soft mask (e.g., a photoresist or polymer). The etch may be a dry etch or wet etch.

In some embodiments, fins 215 having a height of approximately 60 nm may be formed by an SIT process in which a first hard mask is used to pattern the fins. The substrate 210 may be selectively etched, except at regions protected by the first hard mask, to define the fins 215. Subsequently, the spaces between the fins may be filled with an insulator, for example, using a high aspect ratio process (HARP) to deposit an oxide. A chemical mechanical polishing (CMP) step may then be used to planarize the insulator over the fins. The CMP process may stop on the first hard mask or on the tops of the patterned fins. The first hard mask may be removed. An etching process may be used to recess the insulator between the fins, leaving a shallow trench isolation (STI) insulating layer 205 at least near the base of the fins 215, as depicted in FIG. 2B. The recessing of the STI may reveal an upper portion of the fins. The STI layer may be formed locally around one or more fins.

Gate structures may then be patterned over the fins. As depicted in FIGS. 2B-2D, the gate structure may include a gate conductor 234 that is formed adjacent at least three sides of a fin 215, as depicted in FIG. 2D. In some embodiments, a gate insulator 235 may be deposited over the fins using molecular layer deposition (MLD) prior to deposition of the gate conductor 234. The gate insulator 235 may be an oxide or nitride in some instances. For example, the gate insulator may comprise silicon dioxide, silicon nitride, hafnium silicate, zirconium silicate, hafnium dioxide and zirconium dioxide. A conductive material (e.g., amorphous silicon, polysilicon, a metal, a metal silicide, or combination thereof) may be deposited over the gate insulator in some embodiments.

One or more gate conductors may then be patterned in the gate material using a patterned second hard mask 236 to define the location of the gates. The gate material may then be etched back except at locations protected by the second hard mask leaving the gate conductors 234. Additionally, the gate insulator 235 may be etched away from the fins leaving the insulator only below the gate conductor 234. The second hard mask 236 may remain on the gates, in some embodiments. According to some implementations, the second hard mask 236 may be formed of silicon nitride.

In some embodiments, sidewall spacers 232 may be formed adjacent the gate conductor 234, e.g., using a nitridation process. For example a layer of silicon nitride ($SiN_x$) may be conformally deposited over the fins and the gate conductor, and subsequently etched back leaving the spacer only on the sidewalls of the gate conductor, and on sidewalls of the second hard mask 236. In some implementations, sidewall spacers 232 may be formed from any combination of $Si_3N_4$, SiOCN, SiPCN, SiBN, and SiB.

In some implementations, any of the gate insulator 235, the gate conductor 234, and the spacers 232 may be sacrificial. For example, any of these structures may be removed by etching at a later time and replaced with a permanent structure for the finFET's gate. For example, the gate insulator 235 may be replaced with a high K dielectric, the gate conductor 234 and second hard mask 236 may be replaced with a metal or metal silicide gate conductor, and the sidewall spacers 232 may be replaced with a low-k dielectric. Low-k dielectrics may include fluorine-doped silicon dioxide or carbon-doped silicon dioxide.

According to some embodiments, a width of the gate conductor (in a direction along a length of the fin) may be between approximately 12 nm and approximately 50 nm, and in some embodiments may be between approximately 14 nm and approximately 22 nm. In some implementations, the finFETs may be spaced apart (in a direction along a length of the fin) at a regular periodicity or pitch. The pitch of the gate structures may be between approximately 50 nm and approximately 120 nm. In other implementations, the fins may not be spaced apart at regular intervals. In some implementations, shallow trench isolation (STI) structures formed deeper than the insulating layer 205 may be formed around one or more finFETs to provide better insulation between one or more finFETs of the same or different conductivity types (e.g., p-channel and n-channel finFETs).

Figure 2E:
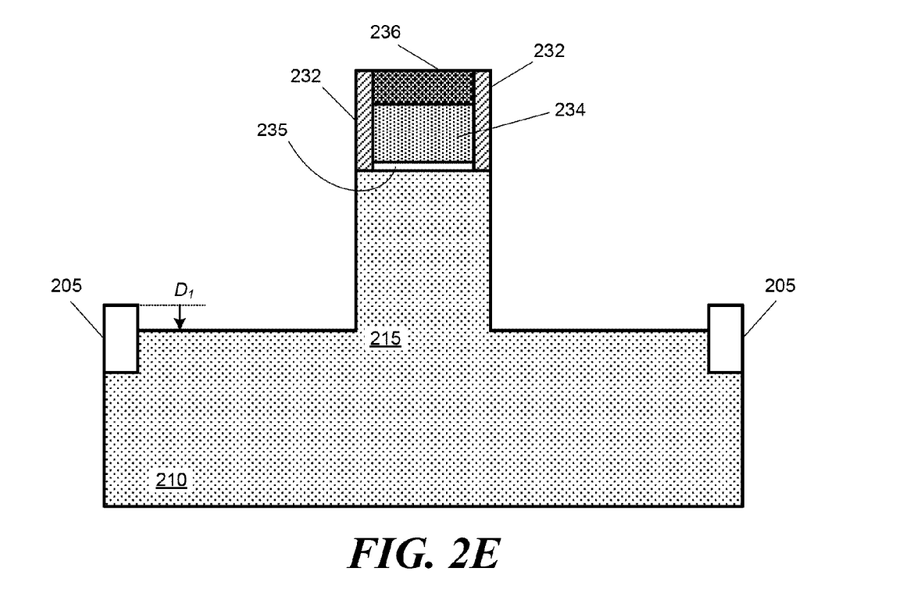

With fins formed as depicted in FIGS. 2A-2D, source and drain regions of the fins may be recessed. According to some embodiments, the source regions 220 and drain regions 240 may be recessed to approximately a level of the insulating layer 205, as depicted in FIG. 2E. In some embodiments, the source and drain regions may be recessed vertically to approximately the top of the insulating layer 205, and a thickness of the insulating layer 205 may be approximately one-half the height of the fin 215 as formed before the source and drain regions are recessed. In some implementations, the source and drain regions of the fins may be etched a short distance $D_1$ below a top of the insulating layer 205. The distance $D_1$ may be between approximately 5 nm and approximately 30 nm. In some aspects, the source and drain regions may be recessed using an anisotropic dry etch, for example, a low-pressure reactive ion etch. However, any suitable selective etching technique, that does not or minimally etches the second hard mask 236 and spacers 232 and insulator 205, may be used to recess the source and drain regions.

Figure 2F:
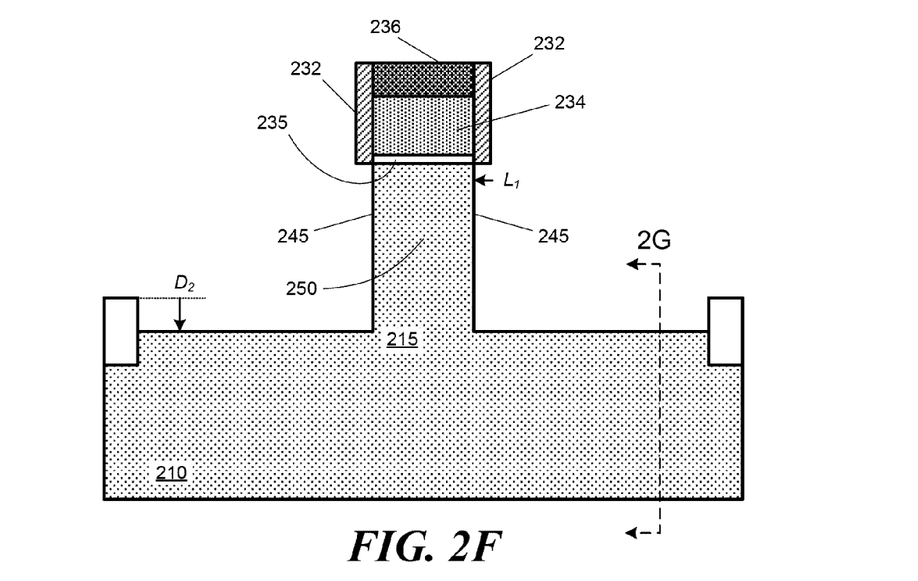

A second etch may be used to laterally or horizontally recess the fins beneath the gate structure, as depicted in FIG. 2F. The second etch may comprise an isotropic etch that recesses the fins horizontally a distance $L_1$ underneath the gate structure. According to some embodiments, the amount of horizontal recess $L_1$ is approximately equal to a thickness of the sidewall spacers 232. For example, the distance $L_1$ may be between approximately 3 nm and approximately 10 nm, according to some embodiments. The second etch process may include, but is not limited to, a timed wet etch process, though any other suitable type of etching process may be used. For example, in embodiments where the fins are formed of silicon germanium (SiGe), the second etch process may be a timed SC1 etch. In some embodiments, the second etch process may be a dry etch process. According to some embodiments, a high-pressure and low-voltage bias plasma etch may be used to laterally etch the fin. In some embodiments, the second etch process may be a homogeneous dry etch, as described in U.S. Pat. No. 8,541,312, which is incorporated herein by reference.

Figure 2G:
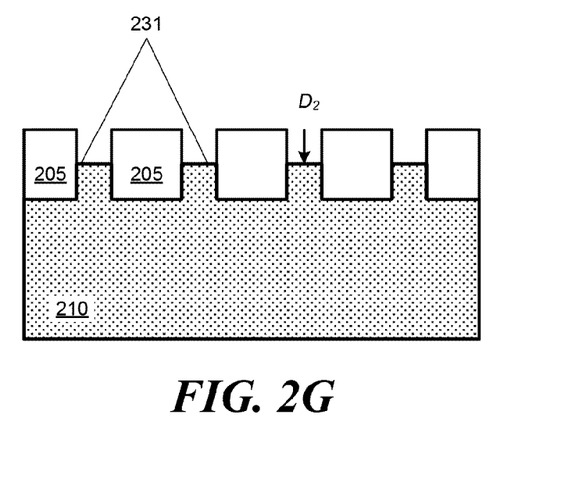

The second etch may further recess the tops of the fins to a distance $D_2$ as depicted in FIGS. 2F-2G. The total recessing of the fin tops at the source and drain regions may be between approximately 20% and approximately 80% of the initial fin height, according to some embodiments. In some implementations, the recessing of the fin tops at the source and drain regions may be between approximately 40% and approximately 60% of the initial fin height. In some cases, the recessing of the fin tops at the source and drain regions may be approximately 50% of the initial fin height. Recessed portions 231 of the fin 215 may remain between the insulating layer 205, as depicted in FIG. 2G.

Figure 2H:
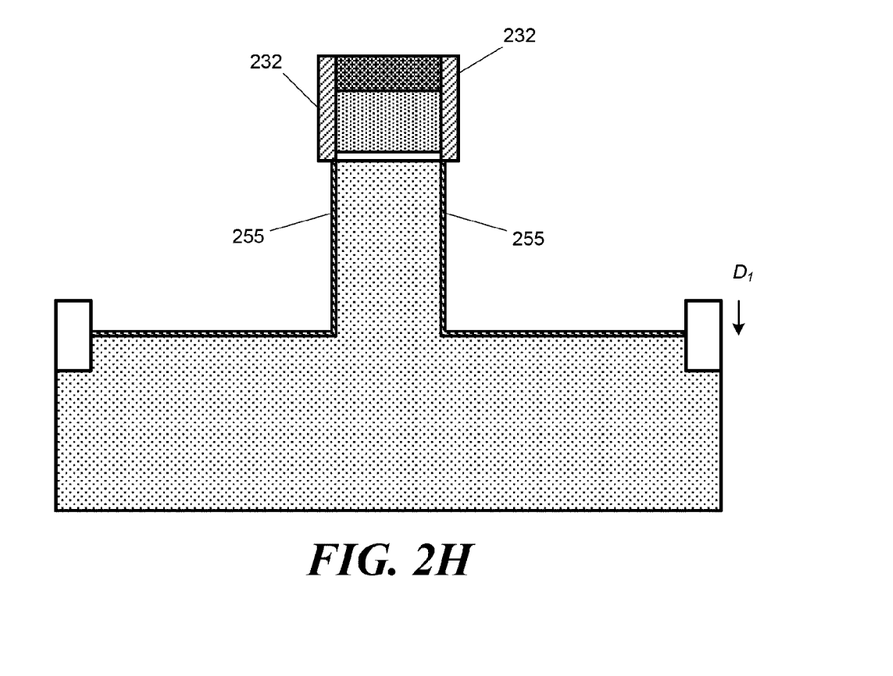

According to some embodiments, a buffer 255 may be deposited over at least the recessed portions 231 of the fins, as depicted in FIG. 2H. The buffer 255 may comprise a high dopant concentration (e.g., a delta dopant concentration) of any suitable acceptor or donor species. In some embodiments, the buffer 255 may comprise several monolayers of boron deposited by atomic layer deposition (ALD), though any suitable dopant species may be used. For example, the buffer 255 may comprise between one and six monolayers of boron having a dopant concentration greater than approximately $1 \times 10^{20}$ cm$^{-3}$. In some embodiments, the buffer 255 may comprise three or four monolayers of boron having a peak dopant concentration of approximately $2 \times 10^{22}$ cm$^{-3}$. In some implementations, a small amount of a second species may be included in the buffer 255. For example, the buffer may include germanium (Ge) or carbon (C) at a lower dopant concentration (for example, less than about $1 \times 10^{19}$ cm$^{-3}$) when deposited. In some implementations, the buffer 255 may be formed on recessed portions of the fin, and may additionally cover vertical end-walls of the fin adjacent a channel region 250 of the fin. The thickness of the buffer may be approximately 2 nm. According to some embodiments, the sidewalls of the fins may be parallel to the (110) planes of the Si semiconductor, and the upper surfaces of the recessed portions 231 may be parallel to the (100) planes. In some implementations, the fin 215 may be formed of silicon and germanium (e.g., a SiGe composition).

Figure 2I:
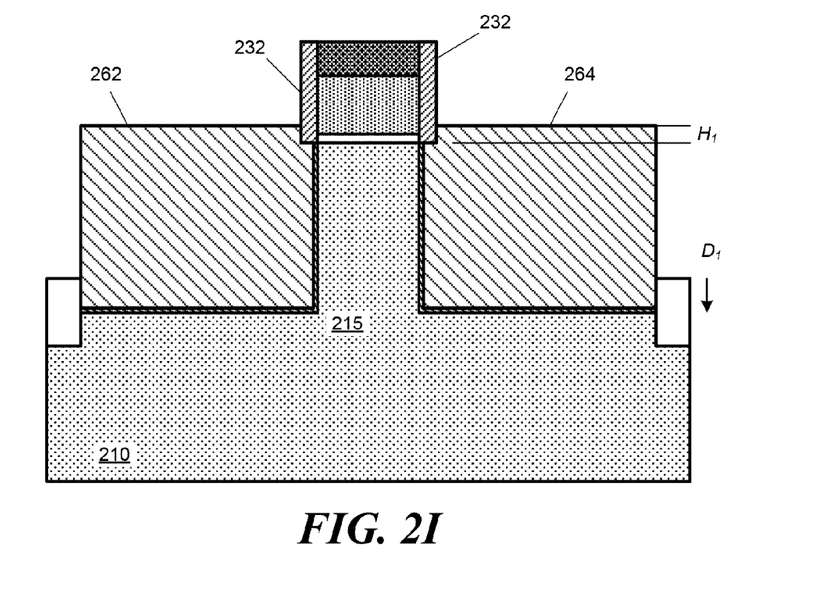

After disposition of the buffer 255, raised source and drain structures 262, 264 may be formed. In some implementations, raised source and drain structures 262, 264 may be epitaxially grown over the buffer 255, as depicted in FIG. 2I. Raised source and drain structures 262, 264 may comprise a semiconductor material that is different from the semiconductor material in which the fins 215 are formed. For example, the raised source and drain structures 262, 264 may be formed of SiGe, wherein the fins may be formed of Si. In various embodiments, the raised source and drain structures 262, 264 may have a lattice constant that differs from a lattice constant of the fin material. Accordingly, the raised source and drain structures 262, 264 may form under compressive or tensile stress and impart strain to a channel region 250 of the finFET.

Figure 2J:
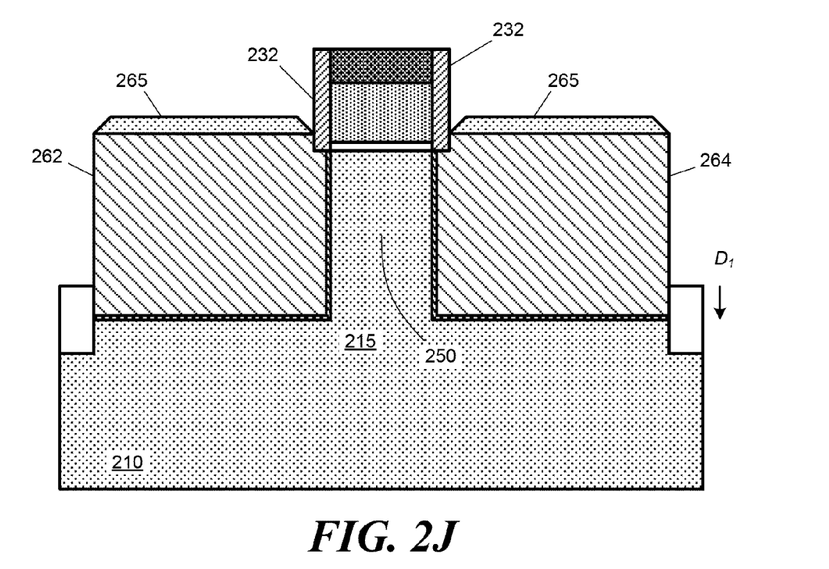

According to some embodiments, raised source and drain structures 262, 264 may be grown to a height greater than a height of the fin 215 at the channel region 250, as depicted in FIG. 2J. For example, a top of the raised source and drain structures 262, 264 may be located above a top of the fin in the channel region. In some implementations, the raised source and drain structures 262, 264 may be between approximately 5 nm and approximately 10 nm above the top of the fin at the channel region.

In some embodiments, the raised source and drain structures 262, 264 may be formed by epitaxial growth. For example, forming the raised source and drain structures may comprise epitaxially growing a same material as the fin but including an impurity species such as germanium or carbon during epitaxial growth. The concentration of the impurity species may be between approximately 30% and approximately 60% in some embodiments. In some embodiments, the concentration of the impurity species may be between approximately 40% and approximately 50%. Additionally, a donor or acceptor species may be added during epitaxial growth so that the raised source and drain regions are doped to a selected concentration. The dopant concentration may be between approximately $1 \times 10^{19}$ cm$^{-3}$ and approximately $1 \times 10^{21}$ cm$^{-3}$, according to some embodiments. In some implementations, the raised source and drain structures comprise Si with a Ge concentration of approximately 42% and a donor or acceptor dopant density of approximately $5 \times 10^{20}$ cm$^{-3}$.

Figure 2K:
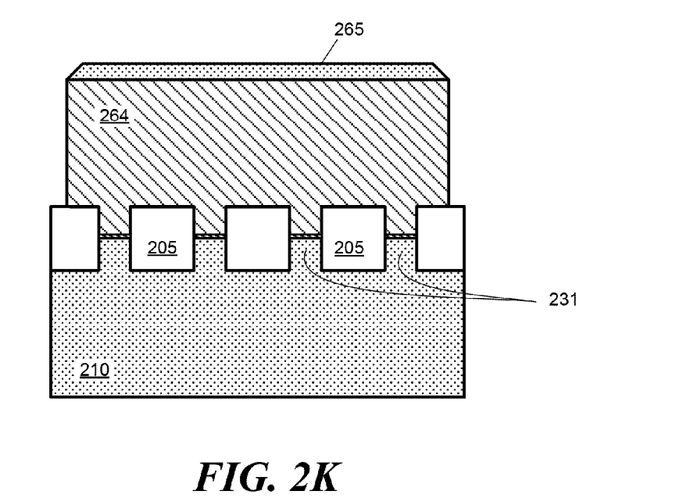

As seen in FIG. 2K, the raised source and drain structures 262, 264 may join a plurality of fins. For example, the raised source and drain structures 262, 264 may epitaxially grow from the recessed portions 231 of the fins and join over the insulating layer 205 between the recessed portions. In some embodiments, a capping layer 265 may be formed over the raised source and drain structures 262, 264, as depicted in FIG. 2J. According to some implementations, a capping layer 265 may be formed of silicon and may include a high dopant concentration for source and drain contacts to the finFET. The capping layer may be between approximately 5 nm and approximately 25 nm thick. In some implementations, the capping layer may be approximately 15 nm thick. The capping layer 265 may not be included in some implementations. Instead, the top of source and drain may be covered with a thin layer of titanium, or may include a nickel platinum silicide contact.

According to some embodiments, the raised source and drain structures 262, 264 and buffer 255 form doped source and drain regions and source and drain extension regions of the finFET, as can be seen from FIG. 2J. The doped source and drain regions can extend under a portion of the gate structure (e.g., under spacers 232) to an edge of the channel region 250 or approximately an edge of the inversion layer when formed. Because of a high dopant concentration provided by the buffer 255, a low resistance can be obtained at the source and drain extensions adjacent the channel region. In some embodiments, diffusion of dopants toward the channel region is not needed, since the buffer 255 provides a high dopant concentration adjacent the channel region of the finFET. Additionally, the buffer 255 can be substantially vertical at opposing ends of the channel region, and provide substantially uniform channel lengths along the height of the finFET. In some implementations, the buffer, source, and drain dopants may be activated by a low temperature process which negligibly diffuses the dopants. Accordingly, the source and drain regions of the finFET may be formed by a diffusion-less process.

Figure 3A:
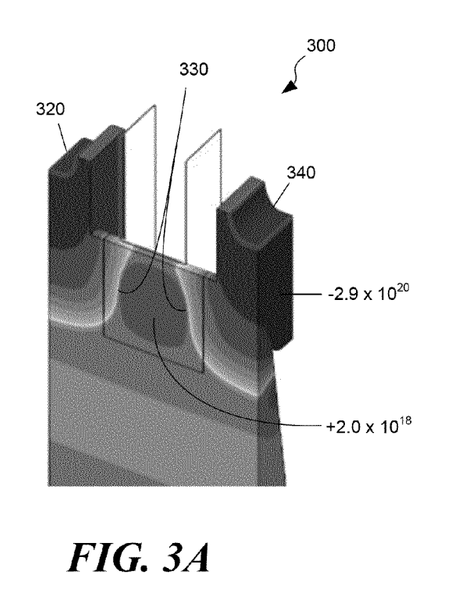
FIGS. 3A-3B illustrate results of numerical simulations of source and drain junction profiles for different fabrication processes.
Figure 3B:
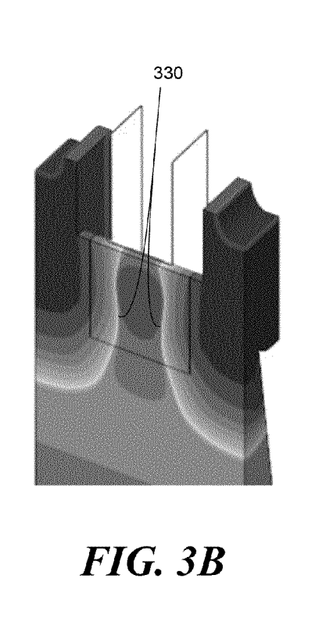

Referring now to FIGS. 3A-3B, source and drain junction profiles 330 are simulated using numerical computations to represent two different finFETs formed by two different processes. These results illustrate some benefits of recessing and regrowing the source and drain regions. In FIG. 3A, the source and drain regions were not recessed before forming raised source and drain regions 320, 340. The source and drain regions have a dopant concentration of $2.9 \times 10^{20}$ cm$^{-3}$ and the channel region has a dopant concentration of $2.0 \times 10^{18}$ cm$^{-3}$. A spike annealed process was used to drive dopants into the fin from the source and drain regions 320, 340. As can be seen in FIG. 3A, the source and drain junction profiles 330 have a tapered profile which leads to a variable effective channel length along the height of the fin.

In FIG. 3B, the source and drain regions were recessed by approximately 30 nm (approximately one-half the initial fin height). The dopant concentrations for the source, drain, and channel regions were the same as used in FIG. 3A. The same spike anneal process was used to drive dopants into the fin from the source and drain regions. As can be seen in FIG. 3B, the source and drain junctions 330 have a more vertical profile than for the process simulated in FIG. 3A.

Figure 4A:
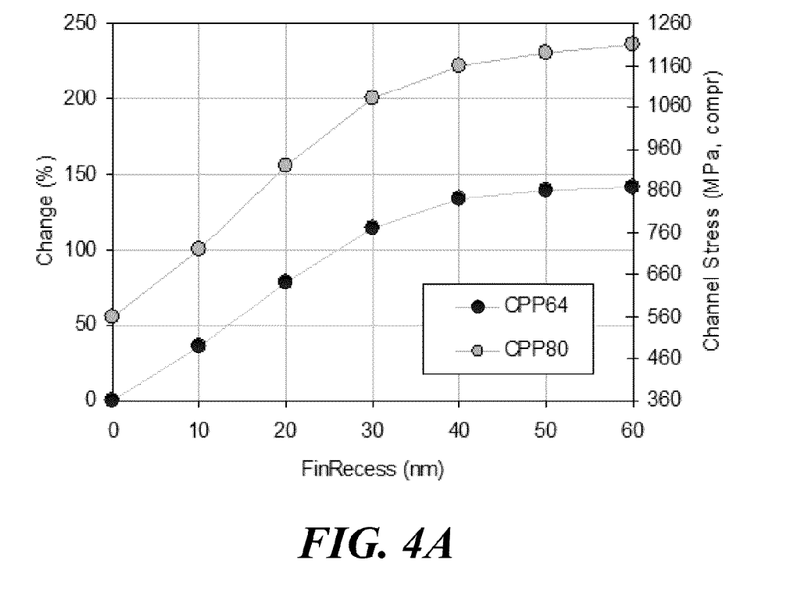
FIGS. 4A-4B illustrate results of numerical simulations of channel stress as a function of vertical fin recess for fins having an initial height of 60 nm.
Figure 4B:
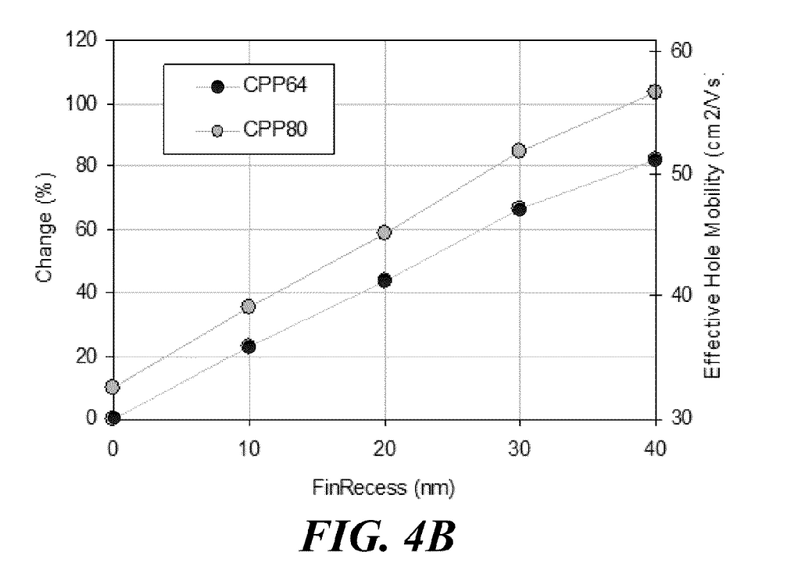

FIGS. 4A-4B depict numerical results of channel stress caused by the formation of raised source and drain structures of a finFET. The simulations were carried out for two different types of finFETs, and plot channel stress and effective hole mobility as a function of the amount of fin recess. The first type of finFET has a spacing between gate structures (along the direction of the length of the fins) of 64 nm, and is shown as the dark filled circles on the plots. The second type of finFET has a spacing between gate structures of approximately 80 nm, and is shown as the lighter shade of filled circles. The simulations were run using a TCAD simulator that included sub-band (Monte Carlo) hole mobility and channel stress in the modeling parameters.

In FIG. 4A, the amount of stress imparted to the finFET's channel by the recessed and raised source and drain structures 262, 264 increases approximately linearly up to a source and drain recess of about 30 nm, and then begins to saturate around 40 nm. For the simulation, the initial height of the fin was approximately 60 nm, and the height of the insulating layer 205 was approximately 30 nm. By recessing the source and drain regions to approximately one-half the fin height, the stress in the channel region can be increased more than 100% for both types of finFETs. The finFETs having longer fin lengths and greater distances between devices (80 nm compared to 64 nm) can provide higher stress values. For example, by increasing the fin spacing to 80 nm, the channel stress increases by more than 50% over the shorter spacing with no source and drain recess.

FIG. 4B plots the change in hole mobility as a function of fin recess for the finFET simulations of FIG. 4A. Corresponding to the increased stress, the effective hole mobility in each type of finFET increases substantially linearly for source and drain recesses up to about 30 nm. For both types of finFETs, the hole mobility is observed to increase by more than 45%.

Figure 5A:
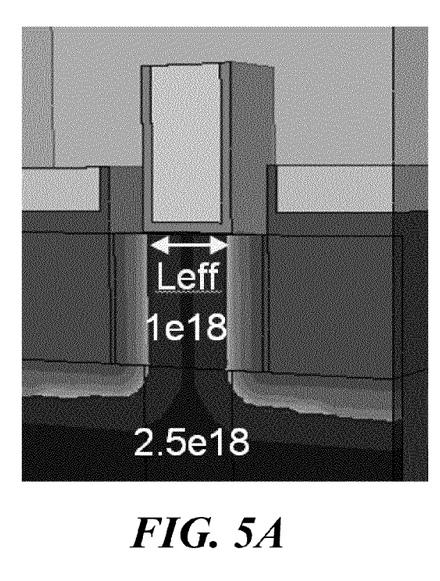
FIGS. 5A-5D represent numerical simulation results comparing $I_{\text{eff}}$ device current for tapered junction and vertical junction finFETs.

FIGS. 5A-5D represent results from numerical simulations that illustrate some benefits of vertical and abrupt source and drain junction profiles in finFETs, according to some embodiments. FIG. 5A illustrates a vertical junction profile of a finFET having a fin width of approximately 10 nm and a fin height of approximately 60 nm. The dopant concentration in the channel region of the finFET was set at approximately $1 \times 10^{18}$ cm$^{-3}$. Device parameters were chosen such that a leakage current for each finFET design trialed was 1 nA.

Figure 5B:
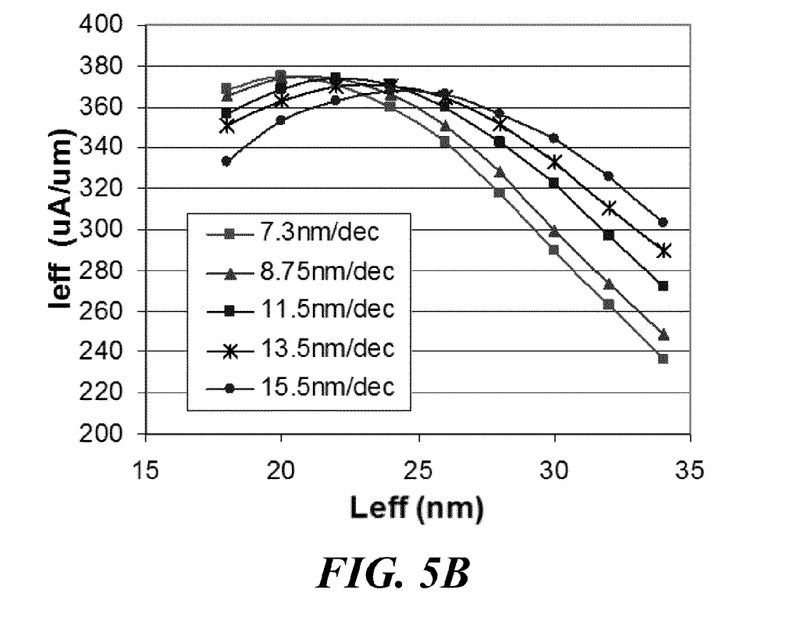

FIG. 5B represents plots of $I_{eff}$, a figure of merit for finFET performance, as a function of effective channel length $L_{eff}$ for five different finFET designs having vertical junction profiles as depicted in FIG. 5A. The five different designs trialed five different source and drain dopant gradients between the source and drain and channel region. The most abrupt or sharp junction included a dopant gradient that changed by one decade over a distance of 7.3 nm. The least abrupt junction included a dopant gradient that changed by one decade over 15.5 nm. For a vertical junction profile as depicted in FIG. 5A, a highest value of $I_{eff}$ was found to occur for the most abrupt dopant gradient at source and drain junctions at an effective channel length of about 20 nm.

For reference, and without being bound to any particular theory, $I_{eff}$ may be expressed as follows:

$$I_{eff} = I_{high} + I_{low}/2$$

Where $I_{high}$ is a value of channel current obtained when the finFET's drain is biased at a voltage of 0.5 $V_{dd}$ and the finFET's gate is biased at $V_{dd}$, and $I_{low}$ is a value of channel current obtained when the finFET's drain is biased at a voltage of $V_{dd}$ and the finFET's gate is biased at 0.5 $V_{dd}$.

Figure 5C:
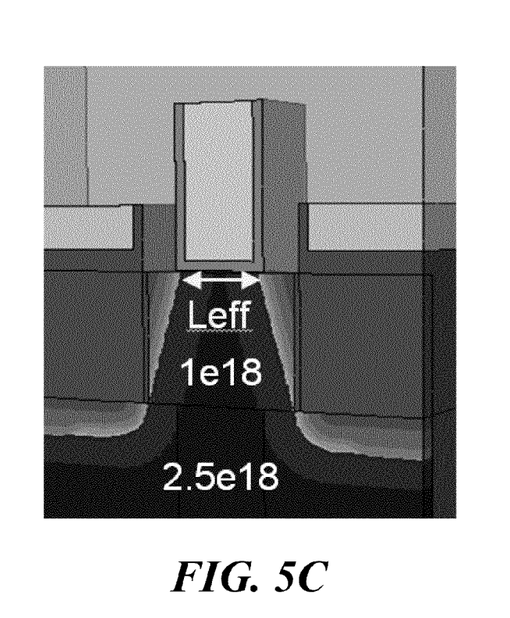
Figure 5D:
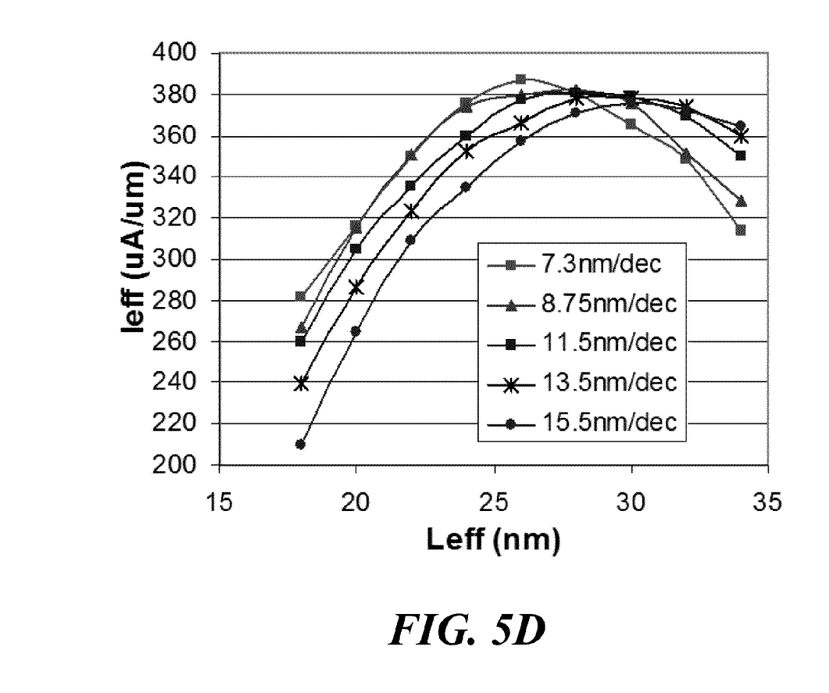

For comparison, simulations were also run for a finFET having a tapered junction profile, as depicted in FIG. 5C. The dopant concentration in the channel region was the same as for the case simulated in FIGS. 5A-5B. Also, the same dopant gradients were used for the tapered junctions. The value of effective channel length was determined at the top of the tapered junction finFET. As can be seen in FIG. 5D, the value of $I_{eff}$ obtained for the tapered junction profile also occurs for the most abrupt dopant gradient, but at an appreciably longer effective channel length of about 26 nm. These results indicate that finFETs with vertical junction profiles can obtain a commensurate level of performance to tapered junction finFETs at appreciably shorter effective channel lengths.

The orientation of the fins with respect to the crystalline planes of the semiconductor can affect several parameters of the device. The orientation may affect the shape and amount of epitaxy on the exposed fin surfaces, the efficiency of coupling strain from the source and drain regions of the fin to the channel region, and the amount of change in mobility of the carriers due to the induced strain. For example, when the sidewalls of the fins are parallel to the (110) crystal planes for Si, the epitaxy tends to form a diamond shape around the fin, and there may be better coupling of strain from the source and drain regions to the channel region. When the sidewalls of the fins are parallel to the (100) crystal planes for Si, the epitaxy tends to form in a more uniformly-thick layer around the fin, and there may be less coupling of strain from the source and drain regions to the channel region. Because changes in mobility due to strain can also depend on crystal orientation, some orientations of fin directions with respect to crystalline planes may be preferred over other orientations to increase carrier mobility in the channel region. Accordingly, the fins may be oriented with respect to the crystal lattice depending on the semiconductor material used and type of conductivity desired.

Although the examples described above are primarily directed to Si/SiGe semiconductor combinations, other semiconductor combinations may be used in other embodiments.

For example, equivalent process steps may be implemented for Ge, GaAs, GaN, InP, and other semiconductor materials.

Although the processing steps depicted in FIGS. 2A-2K illustrate some embodiments for forming finFETs having vertical source and drain junctions, in other embodiments, there may be additional steps or fewer steps than those shown.

The fins shown in the drawings may be spaced laterally from each other on one or more regular spacing intervals. For example, there may be a uniform lateral spacing $d_1$ between all fins. Alternatively, there may be two uniform lateral spacings $d_1$, $d_2$ alternating between successive fins. In some embodiments, the fins may be spaced apart between approximately 10 nm and approximately 50 nm. There may be one or more fins spaced apart per finFET device.

Although the foregoing methods and structures are described in connection with "finFETs," the methods and structures may be employed for variations of finFET devices in some embodiments. For example, according to some implementations, the methods and structures may be employed for the fabrication of tri-gate, pi-gate, or omega-gate transistors. In some embodiments, the methods and structures may be employed for the fabrication of gate-all-around (GAA) transistors.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings depict one or a few transistor structures, it will be appreciated that a large number of transistors can be fabricated in parallel following the described semiconductor manufacturing processes. A finFET device fabricated according to the present teachings may be formed in an integrated circuit in large numbers and at high densities. The transistors may be incorporated as part of microprocessing or memory circuitry for digital or analog signal processing devices and/or used in low-power applications. The transistors may be incorporated in logic circuitry, in some implementations. The transistors may be used in consumer electronic devices such as smart phones, tablets, PDA's, computers, televisions, sensors, microprocessors, microcontrollers, field-programmable gate arrays, digital signal processors, application specific integrated circuits, logic chips, analog chips, and digital signal processing chips.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A finFET comprising:
   a fin formed of a first semiconductor material having a channel region;
   a gate conductor formed over the fin;
   a spacer material formed adjacent the gate conductor;
   recessed portions of the fin formed at source and drain regions of the fin;
   a second semiconductor material formed over the recessed portions; and
   a buffer disposed between the second semiconductor material and the first semiconductor material, wherein a dopant density of the buffer is higher than a dopant density of the first semiconductor material and the second semiconductor material, and wherein a first portion of the buffer extends vertically adjacent an edge of the channel region and the spacer material extends toward the source and drain regions beyond the buffer.

2. The finFET of claim 1, wherein the recessed portions of the fin have upper surfaces lying below an upper surface of a local insulating layer disposed on either side of the recessed portions.

3. The finFET of claim 2, wherein the upper surfaces of the recessed portions lie between approximately 5 nm and approximately 20 nm below the upper surface of the local insulating layer.

4. The finFET of claim 1, wherein the buffer comprises a plurality of layers, each layer consisting essentially of atoms of an acceptor or donor dopant species.

5. The finFET of claim 1, wherein the dopant density of the buffer is between approximately $5 \times 10^{21}$ cm$^{-3}$ and approximately $1 \times 10^{23}$ cm$^{-3}$.

6. The finFET of claim 4, wherein the plurality of layers of the buffer comprises less than or equal to 6 molecular layers.

7. The finFET of claim 1, wherein a second portion of the buffer extends horizontally along upper surfaces of the recessed portions of the fin.

8. The finFET of claim 1, wherein the spacer material extends toward the source and drain regions between approximately 3 nm and approximately 9 nm beyond the buffer.

9. The finFET of claim 1, wherein the first semiconductor material comprises a first semiconductor having a first crystal lattice constant and the second semiconductor material comprises a second semiconductor having a second crystal lattice constant different from the first.

10. The finFET of claim 9, wherein the first semiconductor material is Si and the second semiconductor material is SiGe or SiC.

11. The finFET of claim 1, wherein the second semiconductor material is an epitaxial semiconductor material.

12. The finFET of claim 1, wherein the second semiconductor material extends above an upper surface of the fin at the channel region.

13. A finFET, comprising:
   a plurality of fins, each fin formed of a first semiconductor material having a channel region;
   a gate conductor formed over the plurality of fins;
   a spacer material formed adjacent the gate conductor;
   recessed portions of each fin formed at source and drain regions of the fin;
   a second semiconductor material formed over the recessed portions; and
   a buffer disposed between the second semiconductor material and the first semiconductor material, wherein a first portion of the buffer extends vertically adjacent an edge of the channel region and the spacer material extends toward the source and drain regions beyond the buffer, and
   wherein the second semiconductor material electrically connects the plurality of fins at least at their source regions.

14. The finFET of claim 13, further comprising a third semiconductor material formed at the source and drain regions to cover at least a portion of the second semiconductor material.

15. The finFET of claim 1, wherein the channel region has a length between approximately 10 nm and approximately 40 nm.

16. The finFET of claim 1, wherein the channel region has a height between approximately 30 nm and approximately 100 nm and a width between approximately 5 nm and approximately 15 nm.

17. A method for forming a finFET having vertical source and drain junctions, the method comprising:
   forming a gate conductor over a fin;
   forming a spacer layer on sidewalls of the gate conductor;
   recessing source and drain regions of the fin vertically;
   recessing vertical edges of the fin adjacent a channel region horizontally beyond an outer edge of the spacer layer; and
   depositing a buffer by atomic layer deposition on at least the recessed vertical edges of the channel region.

18. The method of claim 17, wherein recessing the vertical edges of the fin comprises recessing the edges between approximately 3 nm and approximately 9 nm beyond the outer edge of the spacer layer.

19. The method of claim 17, wherein recessing the source and drain regions of the fin vertically comprises etching the fin at the source and drain regions to reduce the fin height by at least 40%.

20. The method of claim 17, wherein recessing the source and drain regions of the fin vertically comprises etching the fin at the source and drain regions to reduce the fin height such that upper surfaces of recessed portions of the fin at the source and drain regions lie below an upper surface of a local insulator disposed on either side of the recessed potions.

21. The method of claim 17, wherein recessing the source and drain regions of the fin vertically comprises etching the fin at the source and drain regions to reduce the fin height such that upper surfaces of recessed portions of the fin at the source and drain regions lie between approximately 5 nm and approximately 20 nm below an upper surface of a local insulator disposed on either side of the recessed portions.

22. The method of claim 17, wherein recessing the vertical edges of the fin comprises isotropically etching the fin.

23. The method of claim 22, wherein recessing the source and drain regions of the fin vertically comprises anisotropically etching the fin.

24. The method of claim 17, wherein depositing the buffer comprises depositing a plurality of layers, each layer consisting essentially of atoms of an acceptor or donor dopant species.

25. The method of claim 17, wherein depositing the buffer further comprises forming the buffer with less than or equal to 6 molecular layers.

26. The method of claim 24, wherein depositing the buffer further comprises doping the buffer with donors or acceptors to a density between approximately $5 \times 10^{21}$ cm$^{-3}$ and approximately $1 \times 10^{23}$ cm$^{-3}$.

27. The method of claim 17, further comprising forming raised source and drain structures at the source and drain regions of the fin, wherein the raised source and drain structures extend above an upper surface of the fin at the channel region.

28. The method of claim 27, wherein the raised source and drain structures are formed of a semiconductor material that has a lattice constant that is different from a lattice constant of the fin.

29. The method of claim 27, wherein forming the raised source and drain structures comprises epitaxially growing the raised source and drain structures.

30. A method for forming a finFET having vertical source and drain junctions, the method comprising:
   forming a gate conductor over a plurality of fins;
   forming a spacer layer on sidewalls of the gate conductor;
   recessing source and drain regions of each fin vertically;
   recessing vertical edges of each fin adjacent a channel region horizontally beyond an outer edge of the spacer layer;
   depositing a buffer by atomic layer deposition on at least the recessed vertical edges of the channel region; and
   forming raised source and drain structures at the source and drain regions of each fin, wherein the raised source and drain structures extend above an upper surface of each fin at the channel region; and
   wherein forming the raised source and drain structures comprises epitaxially growing the raised source and drain structures to connect the plurality of fins at least at the source regions.

31. The method of claim 28, wherein the fin is formed of Si and the raised source and drain structures are formed of SiGe or SiC.

* * * * *